(12) United States Patent
Chang et al.

(10) Patent No.: US 7,355,474 B2
(45) Date of Patent: Apr. 8, 2008

(54) METHODS FOR REDUCING SWITCHING INTERFERENCE IN SWITCHING AMPLIFIERS

(75) Inventors: Ming Hung Chang, Jhubei (TW); Fu Yuan Chen, Alian Township, Kaohsiung County (TW)

(73) Assignee: Anpec Electronics Corporation, Hsinchu (TW)

( * ) Notice: Subject to any disclaimer, the term of this patent is extended or adjusted under 35 U.S.C. 154(b) by 146 days.

(21) Appl. No.: 11/365,708

(22) Filed: Mar. 1, 2006

(65) Prior Publication Data
US 2007/0146066 A1 Jun. 28, 2007

(30) Foreign Application Priority Data
Dec. 13, 2005 (TW) .............................. 94144005 A

(51) Int. Cl.
*H03F 3/38* (2006.01)
(52) U.S. Cl. ..................................... 330/10; 330/207 A
(58) Field of Classification Search ................... 330/10, 330/207 A, 251
See application file for complete search history.

(56) References Cited

U.S. PATENT DOCUMENTS

| 6,262,632 B1 * | 7/2001 | Corsi et al. ................. 330/251 |
| 7,167,046 B2 * | 1/2007 | Maejima ................. 330/207 A |
| 2007/0109049 A1 * | 5/2007 | Wu ............................ 330/251 |

* cited by examiner

*Primary Examiner*—Khanh Van Nguyen
(74) *Attorney, Agent, or Firm*—Egbert Law Offices

(57) ABSTRACT

The present invention discloses a method for reducing switching interference in a switching amplifier. The switching amplifier includes a first half circuit having a first modulator and a first driver circuit, a second half circuit having a second modulator and a second driver circuit, a first reference wave generator for a first reference wave, and a second reference wave generator for a second reference wave. A first input signal and a second input signal are inputted to the first modulator and the second modulator, respectively. A first modulated signal and a second modulated signal are generated and inputted to the first driver circuit and second driver circuit, respectively. There is a time delay between the switching points, wherein the time delay is large enough to avoid mutual interference. Therefore, distortion of the output signal can be eliminated while the input signals are small.

11 Claims, 5 Drawing Sheets

METHODS FOR REDUCING SWITCHING INTERFERENCE IN SWITCHING AMPLIFIERS

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention is related to a method for reducing switching interference in an amplifier, and more specifically to a method for reducing switching interference in a switching amplifier.

BACKGROUND OF THE INVENTION

Architecture of fully differential circuits is commonly adopted in a switching amplifier. FIG. 1(a) shows a schematic drawing of a switching amplifier 10 of the background art. The amplifier 10 comprises a first half circuit 11, a second half circuit 12 and a reference wave generator 13. The circuit 11 and 12 both comprise a modulator and a driver circuit. The reference wave generator 13 is connected to the same input end of a modulator 111 and modulator 121. Signals VIN11 and VIN12 are inputted to the other end of the modulator 111 and modulator 121, respectively. The signals VIN11 and VIN12 are a differential pair, which have opposite AC signals on the same DC level, wherein the DC level is the same as a reference wave 131. Signals VOUT11a and VOUT12a are output signals of modulator 111 and 121, respectively. The modulator 111 and 121 switch when the input signals VIN11 and VIN12 become larger or smaller than the reference signal 131, and then signals VOUT11a and VOUT12a are generated and inputted to driver circuits 112 and 122, respectively. The driver circuits 112 and 122 have constant magnification. Signals VOUT11 and VOUT12 are output signals of driver circuits 112 and 122, respectively. Signals VOUT11 and VOUT12 are inputted to two ends of a load circuit 15, respectively. Thus, a voltage difference VOUT1 is a differential output signal and equal to a value of VOUT11-VOUT12.

As a common reference wave of the first half circuit 11 and second half circuit 12, the reference wave 131 is generated by the wave generator 13. While the first half circuit 11 switches, it may interfere with the second half circuit 12 through the reference wave 131, and lead to an early or late switching of the second half circuit 12. High-frequency switching signals also interfere with switching of the second half circuit 12 through the parasitic capacitance or common power circuit or ground circuit. For example, As shown in FIG. 1(b), while VOUT11 switches at t1, VOUT12 switches at t1 instead of t2, which is due to interference as mentioned above. Similarly, while VOUT12 switches at t3, VOUT11 switches at t3 instead of t4. Therefore, output signals of driver circuit 112 and 122 are the same, i.e., VOUT11 and VOUT12 overlap, and the differential output signal VOUT1 disappears, which is one of the distortion sources of the output signal. If an input signal is small, output error caused by interference is relatively large. Thus, a nonlinear relationship between the input and output signal is generated

BRIEF SUMMARY OF THE INVENTION

The objective of the present invention is to provide a method for reducing switching interference in a switching amplifier. To achieve the objective, the present invention provides different reference waves to two modulators for modulating their input signals, thereby avoiding switching interference as mentioned above.

The switching amplifier comprises a first half circuit comprising a first modulator and a first driver circuit, a second half circuit comprising a second modulator and a second driver circuit, a first reference wave generator for generating a first reference wave, and a second reference wave generator for generating a second reference wave. The first reference wave and the second reference wave are inputted to the same input end of the first modulator and second modulator, respectively. A first input signal and a second input signal are inputted to the other input end of the first modulator and the second modulator, respectively. The first input signal and the second input signal are a differential pair which have the opposite AC signals on the same DC level, and the DC level is the same as that of the first reference wave and the second reference wave. The first and second modulators switch when the first and second input signals become larger or smaller than the first and second reference waves respectively, and then a first modulated signal and a second modulated signal are generated and inputted to the first driver circuit and second driver circuit, respectively.

In the first embodiment of the present invention, the first reference wave and the second reference wave have the same amplitude, frequency and phase. But the first reference wave and the second reference wave have different rising and down slopes. The rising slope of the first reference wave is larger than that of the second reference wave, whereas the down slope of the first reference wave is smaller than that of the second reference wave.

In the second embodiment of the present invention, the first reference wave and the second reference wave have the same frequency, phase and slope. However, the first reference wave is larger than the second reference wave by a first voltage difference in rising slope, whereas the second reference wave is larger than the first reference wave by a second voltage difference in down slope. The first voltage difference and the second voltage difference are the same.

In the embodiments of the present invention, the switching points of the first half circuit and the second half circuit can be separated by using different reference waves, wherein waveforms of the first and second reference wave are geometrically different. There is a time delay between the switching points of the first half circuit and the second half circuit, wherein the time delay is large enough to avoid mutual interference. Therefore, the differential output signal is generated normally, and distortion of the output signal can be eliminated while the input signals are small.

DETAILED DESCRIPTION OF THE INVENTION

Figure 1A:
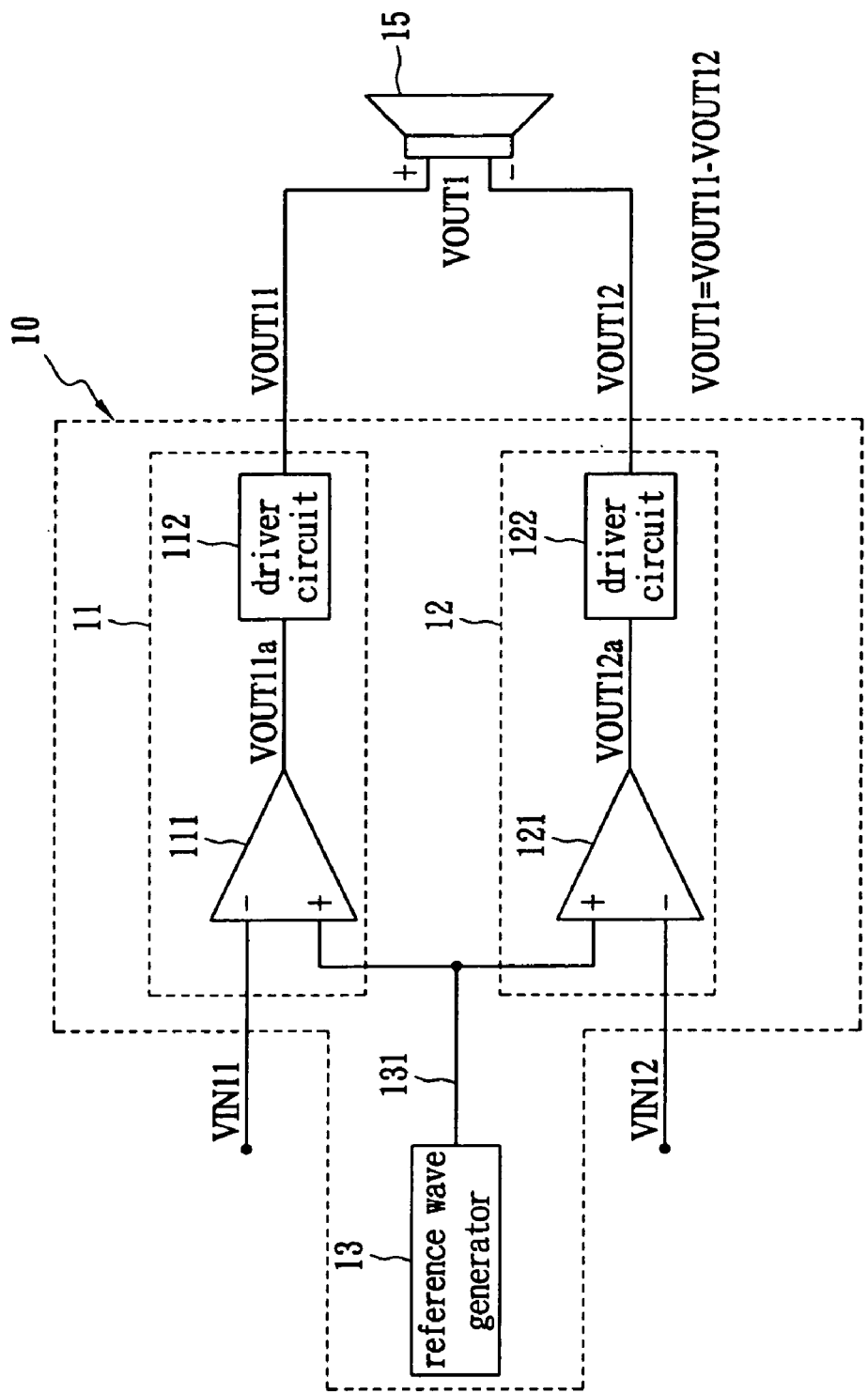
FIG. 1(a) shows a schematic view of a drawing of a switching amplifier of background art.
Figure 1B:
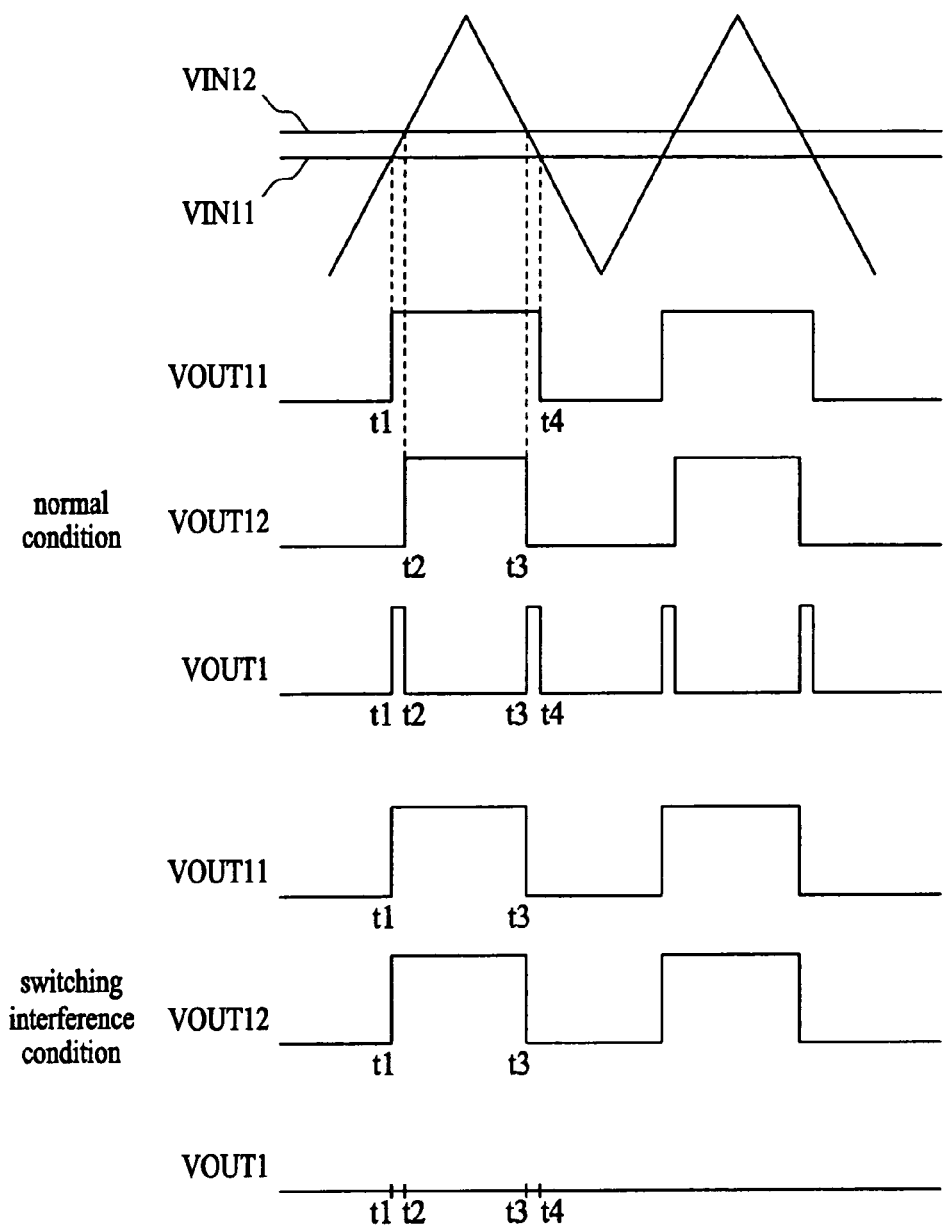
FIG. 1(b) shows another schematic view of waveforms of reference waves, input and output signals of background art.
Figure 2A:
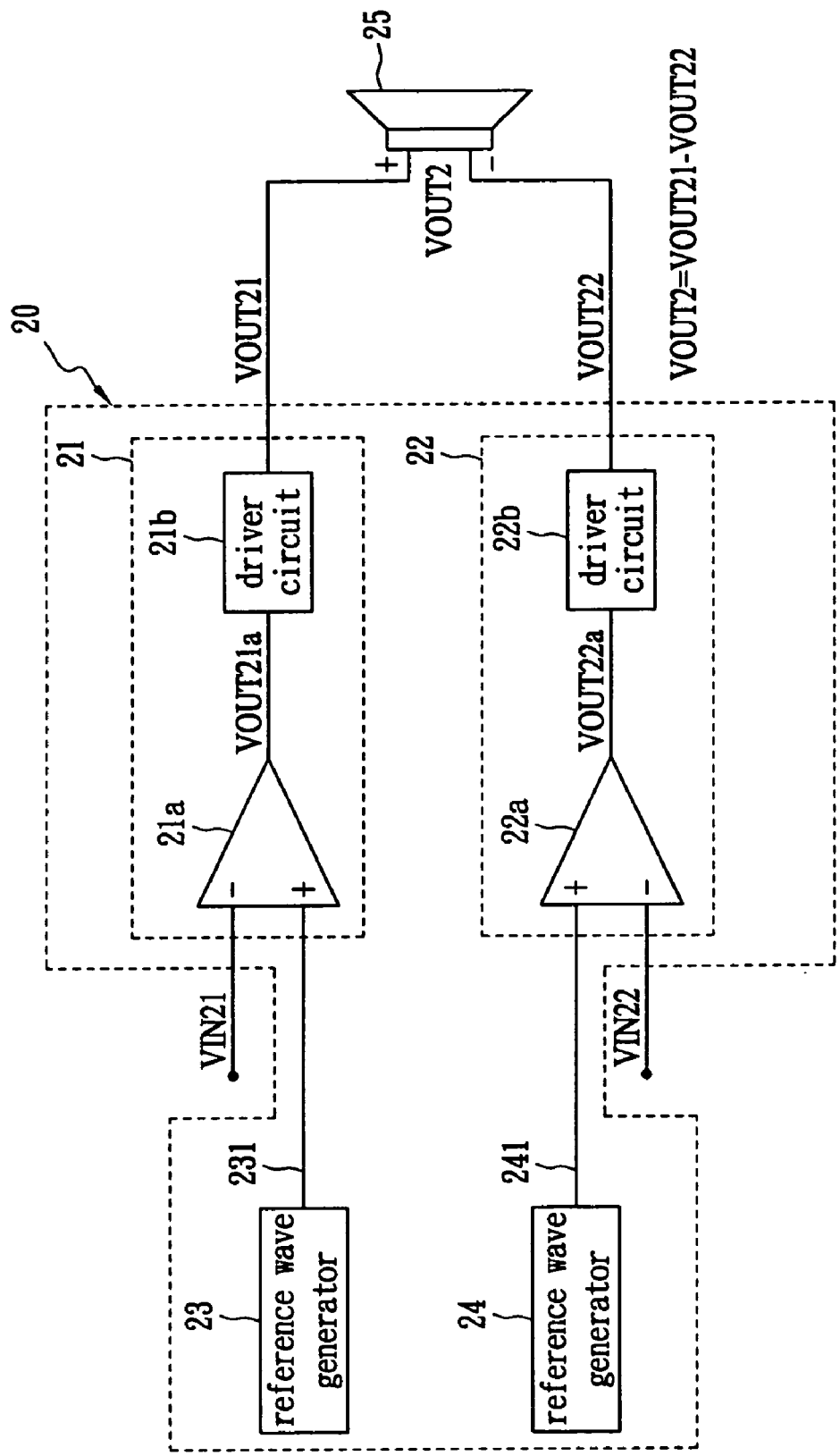
FIG. 2(a) shows a schematic view of a drawing of a switching amplifier of embodiments of the present invention.

FIG. 2(a) shows a schematic drawing of a switching amplifier 20 of embodiments of the present invention. The amplifier 20 comprises a first half circuit 21, a second half circuit 22, a first reference wave generator 23 and a second reference wave generator 24. The first half circuit 21 comprises a first modulator 21a and a first driver circuit 21b, wherein the first modulator 21a and the first driver circuit 21b are serially connected. The second half circuit 22 comprises a second modulator 22a and a second driver circuit 21b, wherein the first modulator 21a and the first driver circuit 22b are serially connected. A first reference wave 231 and a second reference wave 241 are generated by a first reference wave generator 23 and a second reference wave generator 24, respectively, wherein the first and second reference waves are triangular waves in the embodiments of the present invention. Signals VIN21 and VIN22 are input signals of the first modulator 21a and the second modulator 22a, respectively. The modulator 21a and 22a switch when the input signals VIN21 and VIN22 become larger or smaller than reference waves 231 and 241 respectively. Then, a first modulated signal VOUT21a and a second modulated signal VOUT22a are generated and inputted to the first driver circuit 21b and second driver circuit 22b, respectively. Signals VOUT21 and VOUT22 are output signals of the first driver circuit 21b and second driver circuit 22b, respectively. Signals VOUT21 and VOUT22 are inputted to two ends of a load circuit 25, respectively. Thus, a voltage difference VOUT2 is a differential output signal and equal to a value of VOUT21-VOUT22. Signals VIN21 and VIN22 are inputted to the first modulator 21a and the second modulator 22a, respectively. The signals VIN21 and VIN22 are a differential pair. The signals VIN21 and VIN22 have opposite AC signals on the same DC level, wherein the DC level is the same as the first reference wave 231 and the second reference wave 241.

Figure 2B:
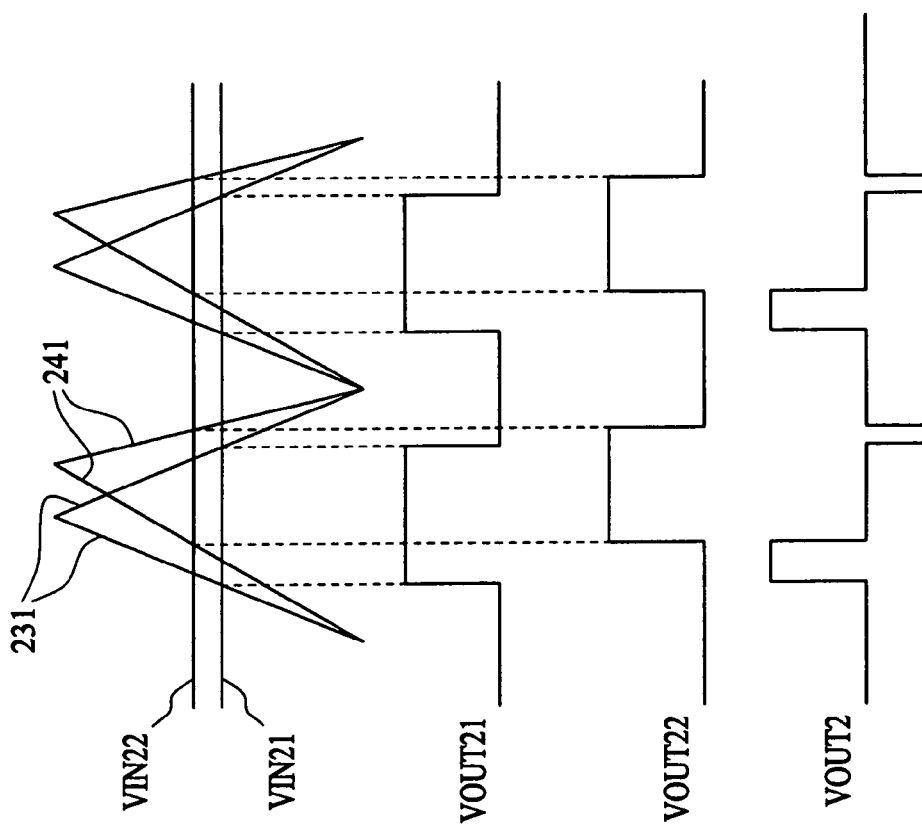
FIG. 2(b) shows another schematic view of waveforms of reference waves, input and output signals in the first embodiment of the present invention.

FIG. 2(b) shows waveforms of reference waves, input and output signals in the first embodiment of the present invention. The first reference wave 231 and the second reference wave 241 have the same amplitude, frequency and phase. But the first reference wave 231 and the second reference wave 241 have a different rising and down slope. The rising slope of the first reference wave 231 is larger than that of the second reference wave 241, whereas the down slope of the first reference wave 231 is smaller than that of the second reference wave 241. While the first reference wave 231 is larger than the signal VIN21, the signal VOUT21 is at a logic high state, whereas when the first reference wave 231 is smaller than the signal VIN21, the signal VOUT21a is at a logic low state, so the signal VOUT21a transmits its logic state at the intersection point of the first reference wave 231 and the signal VIN21. Similarly, the signal VOUT22a transmits its logic state at the intersection point of the second reference wave 241 and the signal VIN22. As the first driver circuit 21b and second driver circuit 22b have constant magnification, so the signals VOUT21a and VOUT21 transmit logic states at the same time, and so do the signals VOUT22a and VOUT22. As shown in FIG. 2(b), while the input signals VIN21 and VIN22 are near zero, there is a time delay between the transition points of signals VOUT21 and VOUT22. This is because there is a time delay between the transition points of signals VOUT21a and VOUT22a, wherein the time delay is large enough to avoid mutual interference between the first half circuit 21 and the second half circuit 22. Therefore, the differential output signal VOUT2 is generated normally, and distortion of the output signal can be eliminated while the input signals are small.

Figure 2C:
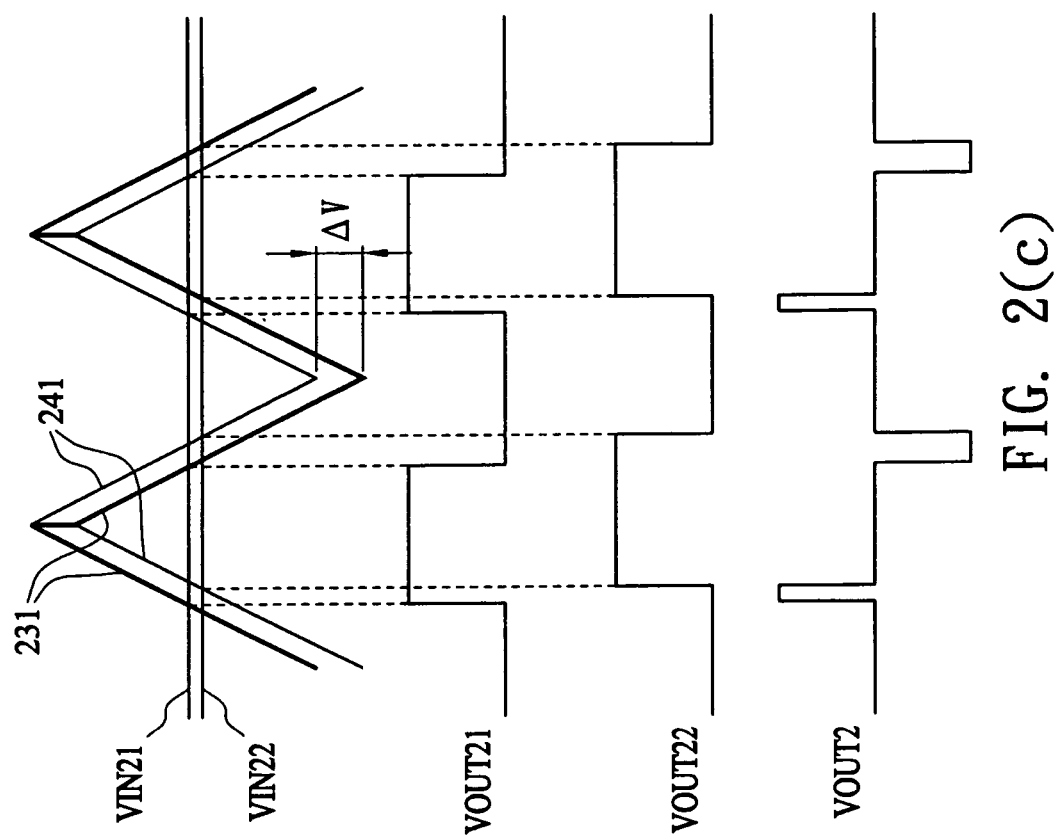
FIG. 2(c) shows a schematic view of waveforms of reference waves, input and output signals in the second embodiment of the present invention.

FIG. 2(c) shows waveforms of reference waves, input and output signals in the second embodiment of the present invention. The first reference wave 231 and the second reference wave 241 have the same frequency, phase and slope. However, the first reference wave 231 is larger than the second reference wave by a voltage difference ΔV in rising slope, whereas the second reference wave is larger than the first reference wave by a voltage difference ΔV in down slope. Therefore, there is a time delay between the transition points of signals VOUT21a and VOUT22a, as well as the signals VOUT21 and VOUT22. The time delay is large enough to avoid mutual interference between the first half circuit 21 and the second half circuit 22. Therefore, the differential output signal VOUT2 is generated normally, and distortion of the output signal can be eliminated while the input signals are small.

In the embodiments of the present invention, the switching points of the first half circuit and the second half circuit can be separated by using different reference waves, wherein the waveforms of the first and second reference waves are geometrically different. There is a time delay between the switching points of the first half circuit and the second half circuit, wherein the time delay is large enough to avoid mutual interference. Therefore, the differential output signal is generated normally, and distortion of the output signal can be eliminated while the input signals are small.

The above-described embodiments of the present invention are intended to be illustrative only. Numerous alternative embodiments may be devised by those skilled in the art without departing from the scope of the following claims.

We claim:

1. A method for reducing switching interference in a switching amplifier, the switching amplifier having a first modulator and a second modulator, the switching amplifier suitable for generating a differential output signal, the method comprising:

inputting a first reference wave and a first input signal to the first modulator;

inputting a second reference wave and a second input signal to the second modulator, a waveform of the first reference wave being geometrically different than the waveform of said second reference wave, said first reference wave having an amplitude and a frequency that is identical to an amplitude and a frequency of said second reference wave;

generating a first modulated signal from an output of said first modulator by modulating the first input signal with said first reference wave; and generating a second modulated signal from an output of said second modulator by modulating said second input signal with said second reference wave, a transition of said first modulated signal having a time delay from a transition of said second modulated signal.

2. The method for reducing switching interference in a switching amplifier of claim 1, wherein said first reference wave and said second reference wave are triangular waves.

3. The method for reducing switching interference in a switching amplifier of claim 1, wherein said first reference wave and said second reference wave have different slopes.

4. The method of reducing switching interference in a switching amplifier of claim 1, wherein a rising slope of said first reference wave is larger than a rising slope of said second reference wave, a down slope of said first reference wave being smaller than a down slope of said second reference wave.

5. A method for reducing switching interference in a switching amplifier, the switching amplifier having a first modulator and a second modulator, the switching amplifier suitable for generating a differential output signal, the method comprising:

inputting a first reference wave and a first input signal to the first modulator;

inputting a second reference wave and a second input signal to the second modulator, a waveform of said first reference wave being geometrically different than the waveform of said second reference wave, said first reference wave having a frequency and a phase and a slope that are identical to a frequency and a phase and a slope of said second reference wave, said first reference wave having a voltage higher by a first voltage difference than a voltage of said second reference wave when said first and second reference waves go up, said second reference wave having a voltage higher than a voltage of said second reference wave when said first and second reference waves go down;

generating a first modulated signal from an output of said first modulator by modulating the first input signal with said first reference wave; and generating a second modulated signal from an output of said second modulator by modulating said second input signal with said second reference wave, a transition of said first modulated signal having a time delay from a transition of said second modulated signal.

6. The method for reducing switching interference in a switching amplifier of claim 5, wherein said first voltage difference is equivalent to said second voltage difference.

7. The method for reducing switching interference in a switching amplifier of claim 5, wherein the switching amplifier has a first driver circuit and a second driver circuit, said first modulated signal and said second modulated signal being inputted to the first driver circuit and the second driver circuit, respectively.

8. The method for reducing switching interference in a switching amplifier of claim 5, wherein the switching amplifier has a first reference wave generator suitable for generating said first reference wave and a second reference wave generator suitable for generating said second reference wave.

9. The method for reducing switching interference in a switching amplifier of claim 7, wherein said first modulator and the first driver circuit are cascaded as a first half circuit, the second modulator and the second driver circuit are cascaded as a second half circuit, and the outputs of the first half circuit and the second half circuit are respectively connected to two ends of a load circuit.

10. The method for reducing switching interference in a switching amplifier of claim 7, wherein the differential output signal is a difference between the output signals of the first driver circuit and the second driver circuit.

11. The method for reducing switching interference in a switching amplifier of claim 5, wherein said first input signal and said second input signal are a differential pair, DC levels of said first and second input signals being the same as DC levels of said first and second reference waves, AC signals on the DC levels of said first and second input signals being opposite in phase.

* * * * *